US011538633B2

(12) United States Patent
Goh et al.

(10) Patent No.: US 11,538,633 B2
(45) Date of Patent: Dec. 27, 2022

(54) COMBINATION STIFFENER AND CAPACITOR

(71) Applicant: Intel Corporation, Santa Clara, CA (US)

(72) Inventors: Eng Huat Goh, Ayer Itam (MY); Jiun Hann Sir, Gelugor (MY); Min Suet Lim, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 637 days.

(21) Appl. No.: 16/306,889

(22) PCT Filed: Jul. 2, 2016

(86) PCT No.: PCT/US2016/040906
§ 371 (c)(1),
(2) Date: Dec. 3, 2018

(87) PCT Pub. No.: WO2018/009166
PCT Pub. Date: Jan. 11, 2018

(65) Prior Publication Data
US 2021/0035738 A1 Feb. 4, 2021

(51) Int. Cl.
*H01G 4/224* (2006.01)
*H01G 4/005* (2006.01)
*H01L 23/16* (2006.01)
*H01L 49/02* (2006.01)
*H05K 1/02* (2006.01)
*H05K 3/28* (2006.01)

(52) U.S. Cl.
CPC ............ *H01G 4/224* (2013.01); *H01G 4/005* (2013.01); *H01L 23/16* (2013.01); *H01L 28/60* (2013.01); *H05K 1/0231* (2013.01); *H05K 3/284* (2013.01)

(58) Field of Classification Search
CPC ...................................................... H01G 4/224
USPC ........................................................ 257/532
See application file for complete search history.

(56) References Cited

U.S. PATENT DOCUMENTS

| 7,115,988 B1* | 10/2006 | Hool | H01L 23/36 257/713 |
| 2003/0178722 A1* | 9/2003 | Xie | H01L 23/16 257/723 |
| 2009/0243756 A1* | 10/2009 | Stevenson | A61N 1/08 333/172 |

(Continued)

OTHER PUBLICATIONS

PCT Application No. PCT/US2016/04906, Filing date Jul. 2, 2016; Eng Huat Eh Goh, International Search Report; dated Nov. 8, 2016; 9 Pages.

(Continued)

*Primary Examiner* — Stanley Tso
(74) *Attorney, Agent, or Firm* — Schwabe, Williamson & Wyatt, P.C.

(57) ABSTRACT

Electronic device package stiffener and capacitor technology is disclosed. A combination stiffener and capacitor can include a structural material configured to be coupled to a substrate. The structural material can have a shape configured to provide mechanical support for the substrate. The combination stiffener and capacitor can also include first and second electrodes forming a capacitor. An electronic device package and a package substrate configured to receive the combination stiffener and capacitor are also disclosed.

17 Claims, 6 Drawing Sheets

(56) References Cited

U.S. PATENT DOCUMENTS

2010/0155927 A1 6/2010 Cheah et al.
2012/0120614 A1* 5/2012 Ueno ................. H05K 1/183
                                                  361/748

OTHER PUBLICATIONS

International Preliminary Report on Patentability for International Patent Application No. PCT/US2016/040906, dated Jan. 17, 2019, 7 pgs.
Office Action from Taiwan Patent Application No. 106118136, dated Nov. 16, 2020, 8 pgs.
Notice of Allowance from Taiwan Patent Application No. 106118136, dated Apr. 6, 2021, 3 pgs.

* cited by examiner

COMBINATION STIFFENER AND CAPACITOR

PRIORITY INFORMATION

This application is a 371 U.S. national stage entry of PCT Application Ser. No. PCT/US2016/040906, filed Jul. 2, 2016, which is incorporated herein by reference in its entirety.

TECHNICAL FIELD

Embodiments described herein relate generally to electronic device packages, and more particularly to stiffeners for package substrates and capacitors disposed thereon.

BACKGROUND

Many computing devices, including mobile, tablet, and ultrabook technologies, require components with increasingly reduced dimensions. The form factor of a semiconductor package utilized in such devices, including XY lateral dimensions and Z height dimension, is limited by the components contained within the package. Components are typically mounted on a surface of a package substrate, therefore the dimensions of the package are generally determined by the Z height of the components and the surface area XY dimensions required to accommodate the components on the surface of the package substrate. Among the components found in many packages are capacitors and stiffeners. Capacitors are commonly used in packages (e.g., CPU packages) as a decoupling solutions (i.e., to reduce inductance) in power delivery networks. Decoupling capacitors may be disposed on the die side of a package (i.e., die side capacitors (DSC)) or on the land side of a package (i.e., land side capacitors (LSC)). Stiffeners are often utilized in packages to provide mechanical reinforcement of thin substrates to minimize warpage across a range of operating temperatures. Stiffeners are typically located on the die side of a package.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
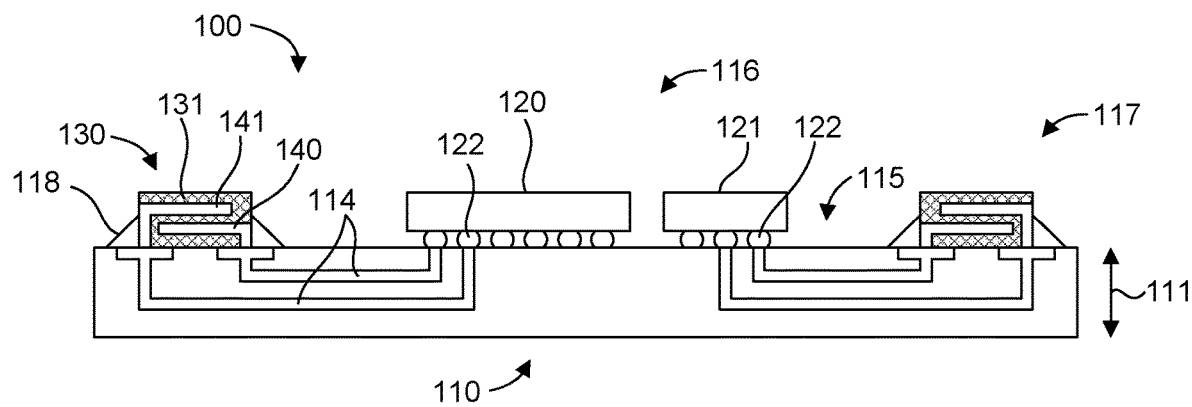
FIG. 1 illustrates a schematic cross-section of an electronic device package in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes support for a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

Locating decoupling capacitors and a stiffener on the same side of a package (e.g., the die side) can significantly increase package XY dimensions. Thus, packages often include LSC with stiffeners located on the die sides. LSC, however, have some drawbacks. In particular, to locate capacitors on the land side of the package, ball grid array (BGA) pads are de-populated and the resulting free space is used for placing the capacitors. This usually translates into a larger footprint or package size (i.e., XY dimension) to meet the landing zone. LSC also have limitations in the Z dimension. For example, low profile capacitors are often needed to clear the standoff distance between the package and the board to which it is mounted. Low profile capacitors, however, are more expensive than typical capacitors and typically have lower capacitance values, thus impacting cost and performance. In addition, for a relatively small ball pitch (e.g., less than about 0.43 mm), a low profile LSC will typically not fit between the package and the board without a recess or cavity (e.g., in the board) to accommodate the capacitors, which increase costs.

Accordingly, a combination stiffener and capacitor is disclosed that combines or integrates a stiffener and a capacitor into a single unified component. In one aspect, the combination stiffener and capacitor can resolve package XYZ dimensional and cost concerns. In one example, a combination stiffener and capacitor can include a structural material configured to be coupled to a substrate. The structural material can have a shape configured to provide mechanical support for the substrate. The combination stiffener and capacitor can also include first and second electrodes forming a capacitor. Electronic device packages and package substrates configured to receive the combination stiffener and capacitor are also disclosed.

Figure 2:
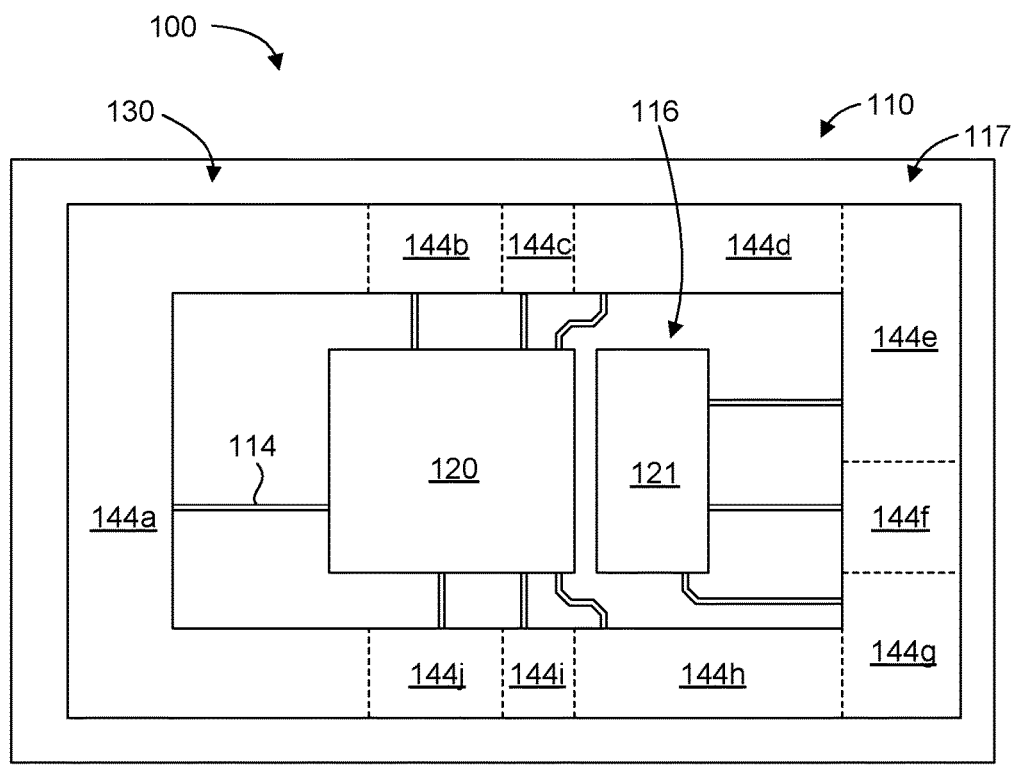
FIG. 2 illustrates a top view of the electronic device package of FIG. 1 in accordance with an example.

Referring to FIG. 1, an exemplary electronic device package 100 is schematically illustrated in cross-section. A top view of the package 100 is shown in FIG. 2. In general, the electronic device package 100 can include a substrate 110, one or more electronic components 120, 121 operably coupled to the substrate 110, and a combination stiffener and capacitor 130. The combination stiffener and capacitor 130 can be a package stiffener integrated or otherwise combined with a capacitor. As such, the combination stiffener and capacitor 130 can be considered a "capacitized stiffener" that can function as a stiffener to mechanically strengthen the package 100 (e.g., minimize warpage of the substrate 110 at room temperature and/or at high temperature) as well as serve as a capacitor that can be in electrical communication with one or more of the electronic components 120, 121 (e.g., to provide decoupling capacitance to reduce inductance in the power delivery network). The substrate 110 is also shown isolated in FIG. 3, which is referred to along with FIGS. 1 and 2 in discussing various aspects of the present technology.

An electronic component can be any electronic device or component that may be included in an electronic device package, such as a semiconductor device (e.g., a die, a chip, a processor, computer memory, platform controller hub, etc.). In one embodiment, each of the electronic components 120, 121 may represent a discrete chip. The electronic components 120, 121 may be, include, or be a part of a processor, memory, or application specific integrated circuit (ASIC) in some embodiments. Although two electronic components 120, 121 are depicted in FIGS. 1 and 2, any suitable number of electronic components can be included. The electronic components 120, 121 can be attached to the substrate 110 according to a variety of suitable configurations including a flip-chip configuration, wire bonding, and the like. The electronic components 120, 121 can be electrically coupled to the substrate 110 using interconnect structures 122 (e.g., the illustrated solder balls and/or wire bonds) configured to route electrical signals between the electronic components 120, 121 and the substrate 110. In some embodiments, the interconnect structures 122 may be configured to route electrical signals such as, for example, I/O signals and/or power or ground signals associated with the operation of the electronic components 120, 121.

The substrate 110 may include electrically conductive elements or electrical routing features (referred to generally at 114) configured to route electrical signals to or from the electronic components 120, 121. The electrical routing features may be internal (e.g., disposed at least partially within a thickness 111 of the substrate 110) and/or external to the substrate 110. For example, in some embodiments, the substrate 110 may include electrical routing features such as pads, vias, and/or traces configured to receive the interconnect structures 122 and route electrical signals to or from the electronic components 120, 121. The pads, vias, and traces can be constructed of the same or similar electrically conductive materials, or of different electrically conductive materials. The electronic device package 100 can also include interconnects (not shown), such as solder balls, for coupling with a substrate (e.g., a circuit board such as a motherboard) for power and/or signaling.

Figure 3:
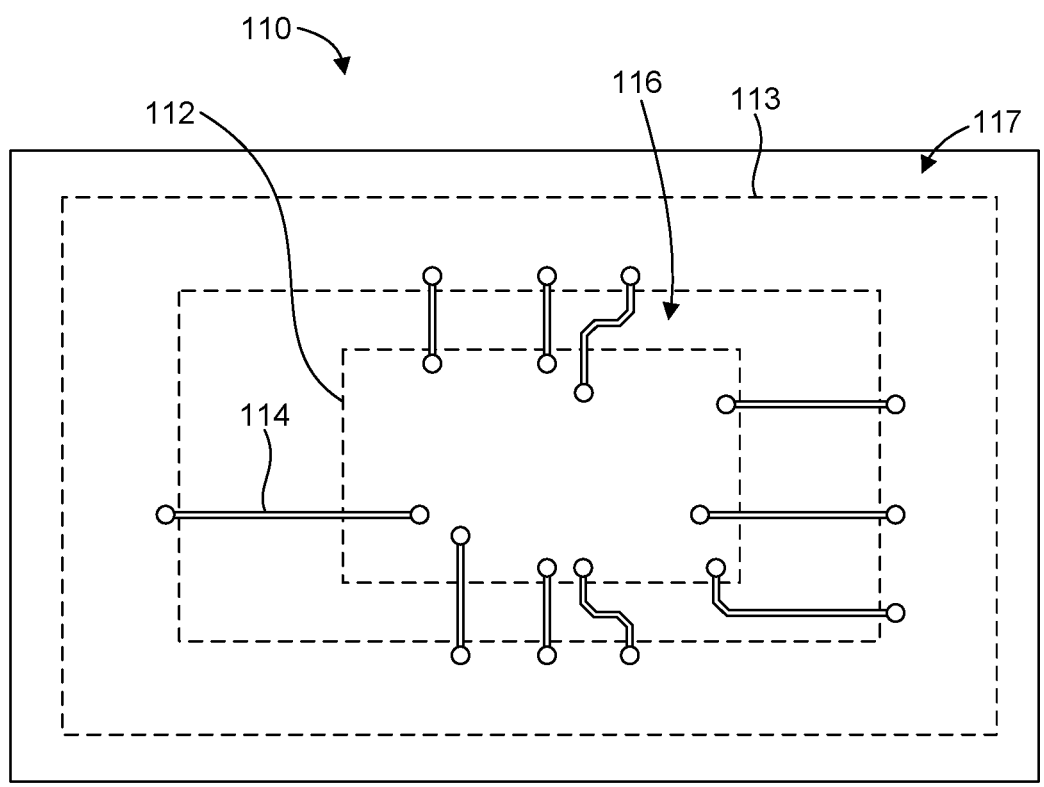
FIG. 3 illustrates a top view of a substrate of the electronic device package of FIG. 1 in accordance with an example.

As illustrated in FIG. 3, the substrate 110 can have an electronic component region 112 to receive the electronic components 120, 121, and a stiffener region 113 to receive a stiffener for mechanical support of the substrate 110. The electronic component region 112 is an area or zone (e.g., a "footprint") on a surface of the substrate 110 where an electronic component is to be disposed. The electronic component region 112 can therefore include any suitable electrical routing features such as pads, vias, and/or traces configured to receive the interconnect structures 122 and route electrical signals to or from the electronic components 120, 121. One or more of the electrically conductive elements 114 can extend between the electronic component region 112 and the stiffener region 113 and can be configured to electrically couple a capacitor disposed in the stiffener region 113 with one or more of the electronic components 120, 121. For example, the electrically conductive elements 114 can be configured to provide electrical communication between the electronic components 120, 121 and the combination stiffener and capacitor 130.

As illustrated, the electronic component region 112 and the stiffener region 113 can be on the same side of the substrate 110. Thus, the combination stiffener and capacitor 130 and the electronic components 120, 121 can be on the same side of the substrate 110 (i.e., the die side 115 of the substrate 110). In one aspect, the electronic component region 112, and therefore the electronic components 120, 121, can be in a center portion 116 of the die side 115 of the substrate 110. In another aspect, the stiffener region 113, and therefore the combination stiffener and capacitor 130, can be in an outer portion 117 of the substrate 110 (e.g., on the die side 115). For example, the stiffener region 113 and the combination stiffener and capacitor 130 can be about a periphery of the electronic component region 112 and the electronic components 120, 121. It should be recognized that the electronic component region 112 and the stiffener region 113 can have any suitable shape or configuration. Non-limiting example combination stiffener and capacitor shapes are illustrated in FIGS. 4A-4F and discussed in more detail below. The stiffener region 113 and the electronic component region 112 can be configured to accommodate any such shape.

Figure 4A:
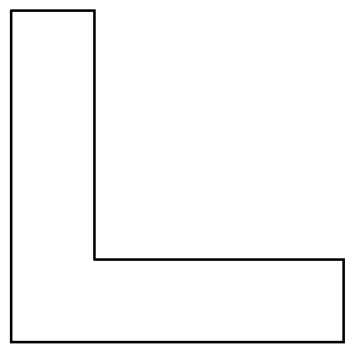
FIGS. 4A-4F illustrate combination stiffener and capacitor shapes in accordance with several examples.
Figure 4B:
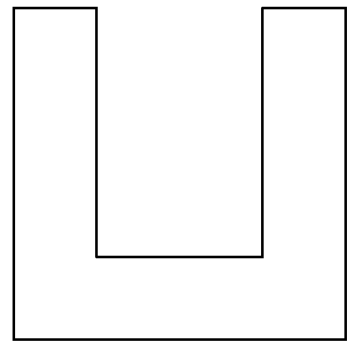
Figure 4C:
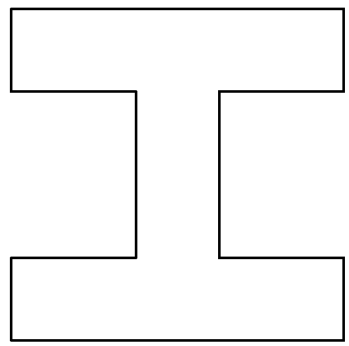
Figure 4D:
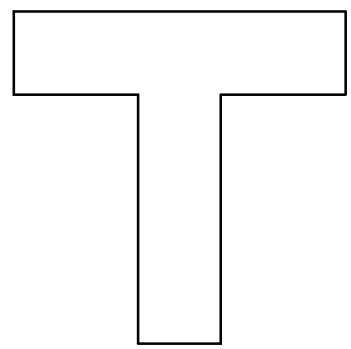
Figure 4E:
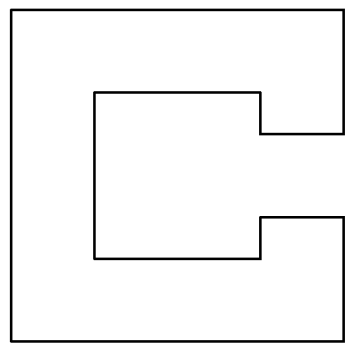
Figure 4F:
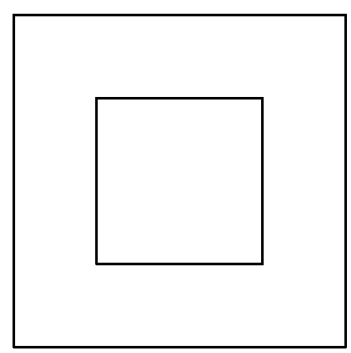

The combination stiffener and capacitor 130 can include a structural material 131 configured to be coupled to the substrate 110. Any structural material with suitable properties (e.g. chemical/mechanical/electrical properties) can be utilized, such as a relatively high strength and/or high hardness material. Some non-limiting examples of structural materials include metals (steel, aluminum, copper, etc.), ceramics, polymers, composites (e.g., fiber reinforced resin and metal matrix composites), glass, etc. A single structural material can be included or multiple structural materials in any combination. In addition to having advantageous physical properties, the structural material 131 can have a shape configured to provide mechanical support for the substrate 110. As shown in FIG. 2, the shape or geometry of the combination stiffener and capacitor 130 can comprise a ring or "picture frame" configuration. In such a configuration, a top profile of the shape can include an interior opening, and the electronic components 120, 121 can be disposed in the opening. In other words, the combination stiffener and capacitor 130 can form a structure about the periphery of the electronic components 120, 121 that "frames" the electronic components on the substrate 110. The top profile shape of the combination stiffener and capacitor 130 can be of any suitable configuration, which may be determined considering stiffening objectives, substrate size/shape, and/or electronic component placement on the substrate. FIGS. 4A-4F illustrate several example configurations for a top profile shape of a combination stiffener and capacitor. The particular examples illustrated show an L configuration (FIG. 4A), a U configuration (FIG. 4B), an I configuration (FIG. 4C), a T configuration (FIG. 4D), a C configuration (FIG. 4E), and an O configuration (FIG. 4F).

In one aspect, a top profile of the shape a combination stiffener and capacitor can comprise a non-rectangular shape. As used in the context of combination stiffener and capacitor shapes, the term "rectangle" is used in a strict sense, specifically, a rectangle is a quadrilateral with exactly four right angles. Thus, none of the shapes illustrated in FIGS. 4A-4F are rectangular according to this meaning of the term. Even though the shape illustrated in FIG. 4F has an outer perimeter or boundary that is rectangular and an inner opening or void that is rectangular, the shape is deemed non-rectangular because it is not a quadrilateral with exactly four right angles due to the presence of the inner opening.

Figure 5:
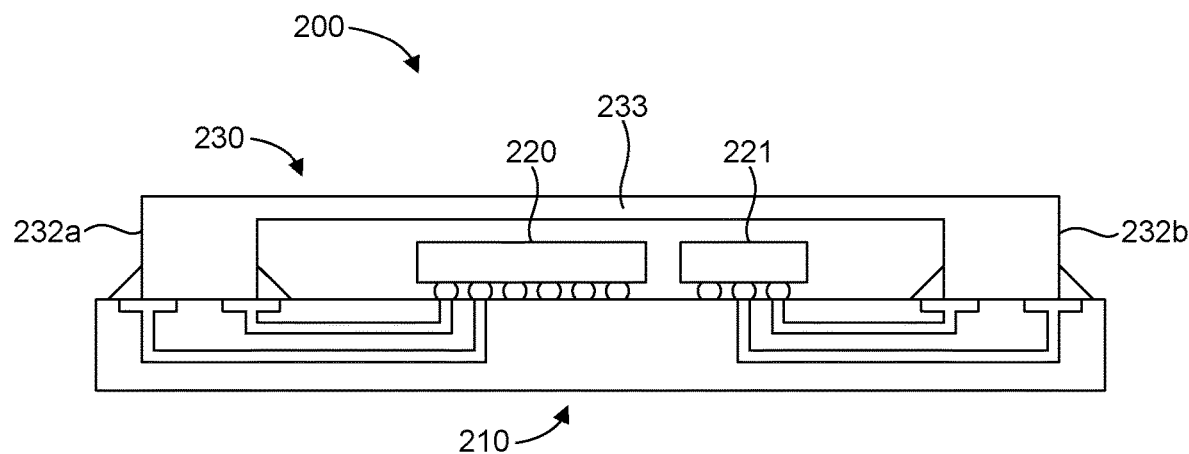
FIG. 5 illustrates a schematic cross-section of an electronic device package in accordance with another example.
Figure 6:
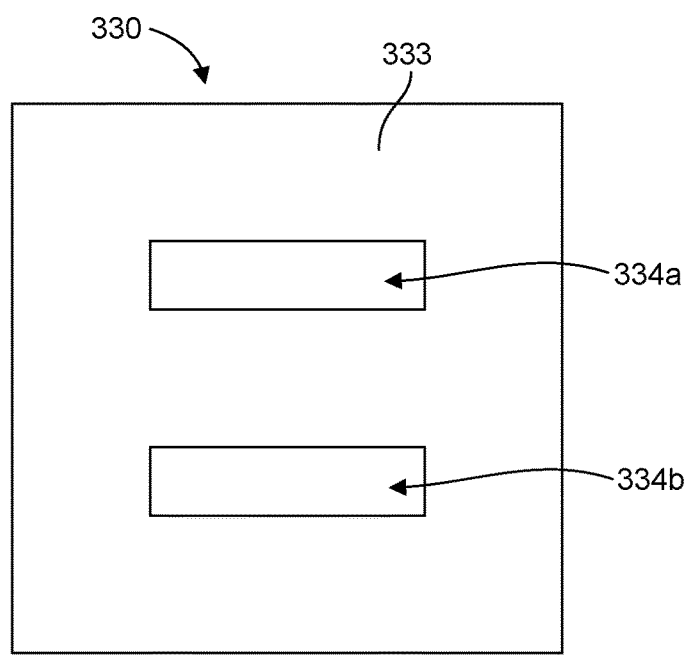
FIG. 6 illustrates a top view of a combination stiffener and capacitor in accordance with an example.

In one aspect, the configurations illustrated in FIGS. 4A-4F may represent combination stiffener and capacitor footprint shapes on a substrate and a combination stiffener and capacitor may have a shape that varies from the footprint at a distance from the substrate. For example, as shown in FIG. 5, an electronic device package 200 can include a combination stiffener and capacitor 230 that has a shape comprising a lid configuration. In such a lid configuration, the combination stiffener and capacitor 230 can have one or more sidewalls 232a, 232b configured to interface with and couple to a substrate 210. The sidewalls 232a, 232b can have any suitable top profile or footprint shape, such as those illustrated in FIGS. 4A-4F. The sidewalls 232a, 232b can support a top portion 233, which can extend between the sidewalls 232a, 232b. In one aspect, the sidewalls 232a, 232b and the top portion 233 can be integrally formed with one another. The sidewalls 232a, 232b can extend from the substrate 210 a suitable distance to provide clearance for the top portion 233 over electronic components 220, 221 disposed on the substrate 210. The top portion 233 can be solid or include openings. For example, FIG. 6 illustrates a top view of a combination stiffener and capacitor 330 that has a lid configuration with openings 334a, 334b through a top portion 333. Such openings can be of any suitable size and/or shape and may be included for any reason, such as to facilitate cooling of electronic components disposed beneath the combination stiffener and capacitor 330.

A vertical cross-section of a combination stiffener and capacitor can also have any suitable shape or geometric configuration, such as those illustrated in FIGS. 4A-4F, which can represent all or only a portion (e.g., a sidewall) of a combination stiffener and capacitor and can be utilized in any suitable orientation. In one aspect, a vertical cross-sectional shape or geometry can be selected with a suitable area moment of inertia about an axis of interest to provide suitable bending stiffness for a given application.

As mentioned above, a stiffener and a capacitor can be integrated into a single component to form a combination stiffener and capacitor in accordance with the present disclosure. Having discussed the structural or stiffener aspects the capacitive aspects will now be addressed. Referring again to FIGS. 1 and 2, the combination stiffener and capacitor 130 can include electrodes 140, 141 that form a capacitor, which is integrated with a stiffener, and coupled to one or more of the electronic components 120, 121 by the electrically conductive elements 114. Any suitable capacitor configuration can be incorporated or integrated with a suitable stiffener configuration. In one aspect, the structural material 131 can comprise a dielectric material (e.g., ceramic, polymer, glass, certain composites, etc.). In this case, a portion of the structural material 131 can be disposed between the electrodes 140, 141 to maintain separation of the electrodes for proper capacitive function. Thus the electrodes 140, 141 can be integrated with the structural material 131 to form a capacitor, with the structural material 131 also having a shape configured to provide stiffness for reinforcement of the substrate 110. In another aspect, the electrodes 140, 141 can be separated from one another by an air gap and/or a dielectric or electrically insulating material (e.g., a structural and/or a non-structural material). Any suitable dielectric material can be utilized, such as paper, glass, rubber, ceramic, plastic, etc. In this case, the structural material 131 can be shaped to provide stiffness for reinforcement of the substrate 110 but may serve limited or not function in a capacitor integrated into or housed by the structure.

Solder and/or a conductive adhesive 118 can be used to electrically couple the electrodes 140, 141 to the electrically conductive elements 114, which may also serve to mechanically couple or attach the combination stiffener and capacitor 130 to the substrate 110. Additional adhesives (e.g., epoxy) that may be non-conductive can also be used to mechanically couple or attach the combination stiffener and capacitor 130 to the substrate 110. The combination stiffener and capacitor 130 can be mechanically attached to the substrate 110 at selected or spot interface locations or continuously about an interface, which can affect the bending stiffness of the package. The combination stiffener and capacitor 130 can be coupled to the substrate 110 during assembly of the package 100 as with a typical stiffener or capacitor. Thus installed, the combination stiffener and capacitor 130 not only can stiffen the package 100, but can also behave as a decoupling solution (e.g., disposed on the die side 115) for the power delivery network. By combining a stiffener and a capacitor into a single unit no additional space or accommodation need be provided for a package capacitor. As a result, the package 100 need not include any LSC thereby benefitting the Z dimension of the package 100, and no enlargement of the substrate 100 need be made to accommodate a DSC thereby benefitting XY dimensions of the package 100.

With particular reference to FIG. 2, the capacitive portion of the combination stiffener and capacitor 130 can be partitioned to provide multiple capacitors, which can be coupled to different systems or elements of the electronic components 120, 121 (e.g., different power delivery rails). For example, the combination stiffener and capacitor 130 can include multiple pairs of electrodes 140, 141 that can form multiple capacitor portions or blocks 144a-j. Each of the capacitor portions 144a-j can have any suitable capacitance value, which may be the same or different from one another. The conductive elements 114 can be electrically coupled to the electronic components 120, 121 and the capacitor portions 144a-j. This is also illustrated in FIG. 3 where the conductive elements 114 are shown terminating at multiple locations in the electronic component region 112 and at multiple locations in the stiffener region 113.

Figure 7:
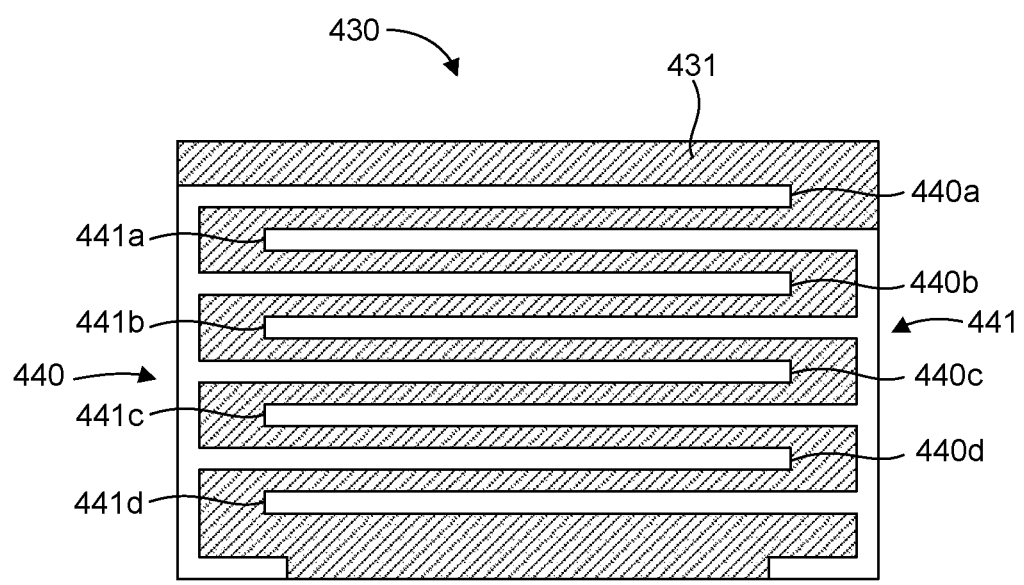
FIG. 7 illustrates a cross-section of a combination stiffener and capacitor in accordance with an example.

FIG. 7 illustrates a cross-section of a combination stiffener and capacitor 430 in accordance with another example of the present disclosure. In this case, electrodes 440, 441 that form a capacitor each comprise a plurality of layers of conductive material. For example, the electrode 440 includes conductive layers 440a-d and the electrode 441 includes conductive layers 441a-d. The conductive layers 440a-d alternate with the conductive layers 441a-d. Dielectric structural material 431 can be disposed or layered between the layers of conductive material 440a-d, 441a-d to form a multilayer capacitor, such as a multilayer ceramic capacitor (MLCC), integrated with a stiffener for a substrate. This configuration can provide much higher capacitance per area compared to a typical low profile LSC and is suitable for use in an ultra-thin core package (UTC). The combination stiffener and capacitor 430 can be constructed utilizing current MLCC fabrication techniques with minor adjustments, such as altering the singulation process.

Figure 8:
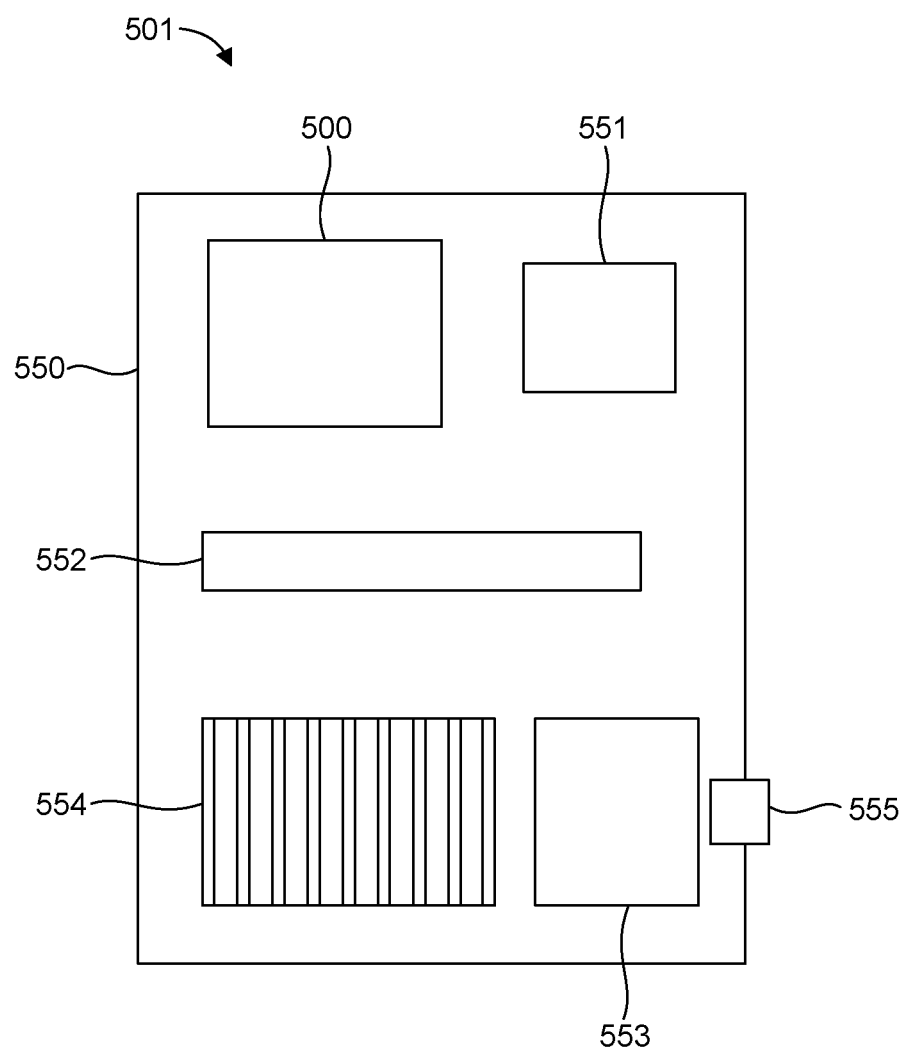
FIG. 8 is a schematic illustration of an exemplary computing system.

FIG. 8 illustrates an example computing system 501. The computing system 501 can include an electronic device package 500 as disclosed herein, coupled to a motherboard 550. In one aspect, the computing system 501 can also include a processor 551, a memory device 552, a radio 553, a heat sink 554, a port 555, a slot, or any other suitable device or component, which can be operably coupled to the motherboard 550. The computing system 501 can comprise any type of computing system, such as a desktop computer, a laptop computer, a tablet computer, a smartphone, a wearable device, a server, etc. Other embodiments need not include all of the features specified in FIG. 8, and may include alternative features not specified in FIG. 8.

EXAMPLES

The following examples pertain to further embodiments.

In one example there is provided a combination stiffener and capacitor comprising a structural material configured to be coupled to a substrate and having a shape to provide mechanical support for the substrate, and first and second electrodes forming a capacitor.

In one example of a combination stiffener and capacitor, the structural material comprises a dielectric material and a portion of the structural material is disposed between the first and second electrodes.

In one example of a combination stiffener and capacitor, the structural material comprises a ceramic material.

In one example of a combination stiffener and capacitor, the first and second electrodes each comprise a plurality of layers of conductive material.

In one example of a combination stiffener and capacitor, the first and second electrodes each comprise a plurality of electrodes forming a plurality of capacitor portions.

In one example of a combination stiffener and capacitor, at least two of the capacitor portions have different capacitance values.

In one example of a combination stiffener and capacitor, a top profile of the shape comprises a non-rectangular shape.

In one example of a combination stiffener and capacitor, a top profile of the shape comprises an interior opening.

In one example of a combination stiffener and capacitor, a top profile of the shape comprises an L configuration, a T configuration, an I configuration, a C configuration, a U configuration, an O configuration, or a combination thereof.

In one example of a combination stiffener and capacitor, a vertical cross-section of the shape comprises an L configuration, a T configuration, an I configuration, a C configuration, a U configuration, an O configuration, or a combination thereof.

In one example of a combination stiffener and capacitor, the shape comprises a ring configuration.

In one example of a combination stiffener and capacitor, the shape comprises a lid configuration.

In one example there is provided a substrate comprising an electronic component region to receive an electronic component, a stiffener region to receive a stiffener for mechanical support of the substrate, and a conductive element extending between the electronic component region and the stiffener region, wherein the conductive element is configured to electrically couple a capacitor disposed in the stiffener region with the electronic component.

In one example of a substrate, the electronic component region and the stiffener region are on a same side of the substrate.

In one example of a substrate, the electronic component region is in a center portion of the side of the substrate.

In one example of a substrate, the stiffener region is in an outer portion of the side of the substrate.

In one example of a substrate, the stiffener region is about a periphery of the electronic component region.

In one example of a substrate, the conductive element is disposed at least partially within a thickness of the substrate.

In one example of a substrate, the conductive element comprises a plurality of conductive elements.

In one example of a substrate, the plurality of conductive elements terminate at multiple locations in the stiffener region.

In one example of a substrate, the plurality of conductive elements terminate at multiple locations in the electronic component region.

In one example there is provided an electronic device package comprising a substrate, an electronic component operably coupled to the substrate, and a combination stiffener and capacitor having a structural material coupled to the substrate and having a shape configured to provide mechanical support for the substrate, and first and second electrodes forming a capacitor, wherein the electronic component and the capacitor are in electrical communication.

In one example of an electronic device package, the electronic component and the combination stiffener and capacitor are on a same side of the substrate.

In one example of an electronic device package, the electronic component is in a center portion of the side of the substrate.

In one example of an electronic device package, the combination stiffener and capacitor is in an outer portion of the side of the substrate.

In one example of an electronic device package, the combination stiffener and capacitor is about a periphery of the electronic component.

In one example of an electronic device package, a top profile of the shape comprises a non-rectangular shape.

In one example of an electronic device package, a top profile of the shape comprises an interior opening.

In one example of an electronic device package, the electronic component is disposed in the opening.

In one example of an electronic device package, a top profile of the shape comprises an L configuration, a T configuration, an I configuration, a C configuration, a U configuration, an O configuration, or a combination thereof.

In one example of an electronic device package, a vertical cross-section of the shape comprises an L configuration, a T configuration, an I configuration, a C configuration, a U configuration, an O configuration, or a combination thereof.

In one example of an electronic device package, the shape comprises a ring configuration.

In one example of an electronic device package, the shape comprises a lid configuration.

In one example, an electronic device package comprises a conductive element to electrically couple the electronic component and the capacitor.

In one example of an electronic device package, the conductive element is disposed at least partially within a thickness of the substrate.

In one example of an electronic device package, the conductive element comprises a plurality of conductive elements.

In one example of an electronic device package, the first and second electrodes each comprise a plurality of electrodes forming a plurality of capacitor portions, and wherein the plurality of conductive elements are electrically coupled to the plurality of capacitor portions.

In one example of an electronic device package, at least two of the capacitor portions have different capacitance values.

In one example there is provided a computing system comprising a motherboard, and an electronic device package operably coupled to the motherboard, the electronic device package including a substrate, an electronic component operably coupled to the substrate, and a combination stiffener and capacitor having a structural material coupled to the substrate and having a shape configured to provide mechanical support for the substrate, and first and second electrodes forming a capacitor, wherein the electronic component and the capacitor are in electrical communication.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided a method for making a combination stiffener and capacitor comprising forming a first electrode and a second electrode separated by a structural dielectric material to form a capacitor, and forming the structural dielectric material as a stiffener with a shape configured to provide mechanical support for a substrate.

In one example of a method for making a combination stiffener and capacitor, the structural dielectric material comprises a ceramic material.

In one example of a method for making a combination stiffener and capacitor, the first and second electrodes each comprise a plurality of layers of conductive material, and wherein each layer of conductive material is separated by a layer of the structural dielectric material.

In one example of a method for making a combination stiffener and capacitor, the first and second electrodes each comprise a plurality of electrodes forming a plurality of capacitor portions.

In one example of a method for making a combination stiffener and capacitor, at least two of the capacitor portions have different capacitance values.

In one example of a method for making a combination stiffener and capacitor, a top profile of the shape comprises a non-rectangular shape.

In one example of a method for making a combination stiffener and capacitor, a top profile of the shape comprises an interior opening.

In one example of a method for making a combination stiffener and capacitor, a top profile of the shape comprises an L configuration, a T configuration, an I configuration, a C configuration, a U configuration, an O configuration, or a combination thereof.

In one example of a method for making a combination stiffener and capacitor, a vertical cross-section of the shape comprises an L configuration, a T configuration, an I configuration, a C configuration, a U configuration, an O configuration, or a combination thereof.

In one example of a method for making a combination stiffener and capacitor, the shape comprises a ring configuration.

In one example of a method for making a combination stiffener and capacitor, the shape comprises a lid configuration.

In one example there is provided a method for making an electronic device package comprising coupling an electronic component to a substrate, and coupling a combination stiffener and capacitor to the substrate, the combination stiffener and capacitor including a structural material having a shape configured to provide mechanical support for the substrate, and first and second electrodes forming a capacitor, wherein the electronic component and the capacitor are in electrical communication.

In one example of a method for making an electronic device package, the structural material comprises a dielectric material and a portion of the structural material is disposed between the first and second electrodes.

In one example of a method for making an electronic device package, the structural material comprises a ceramic material.

In one example of a method for making an electronic device package, the electronic component and the combination stiffener and capacitor are coupled to a same side of the substrate.

In one example of a method for making an electronic device package, the electronic component is in a center portion of the side of the substrate.

In one example of a method for making an electronic device package, the stiffener is in an outer portion of the side of the substrate.

In one example of a method for making an electronic device package, the stiffener is about a periphery of the electronic component.

In one example of a method for making an electronic device package, a top profile of the shape comprises a non-rectangular shape.

In one example of a method for making an electronic device package, a top profile of the shape comprises an interior opening.

In one example of a method for making an electronic device package, the electronic component is disposed in the opening.

In one example of a method for making an electronic device package, a top profile of the shape comprises an L configuration, a T configuration, an I configuration, a C configuration, a U configuration, an O configuration, or a combination thereof.

In one example of a method for making an electronic device package, a vertical cross-section of the shape comprises an L configuration, a T configuration, an I configuration, a C configuration, a U configuration, an O configuration, or a combination thereof.

In one example of a method for making an electronic device package, the shape comprises a ring configuration.

In one example of a method for making an electronic device package, the shape comprises a lid configuration.

In one example of a method for making an electronic device package, the substrate comprises a conductive element to electrically couple the electronic component and the capacitor.

In one example of a method for making an electronic device package, the conductive element is disposed at least partially within a thickness of the substrate.

In one example of a method for making an electronic device package, the conductive element comprises a plurality of conductive elements.

In one example of a method for making an electronic device package, the first and second electrodes each comprise a plurality of electrodes forming a plurality of capacitor portions, and wherein the plurality of conductive elements are electrically coupled to the plurality of capacitor portions.

In one example of a method for making an electronic device package, at least two of the capacitor portions have different capacitance values.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
a substrate having a lateral width;
a first electronic component and a second electronic component coupled to the substrate; and
a combination stiffener and capacitor coupled to the substrate, the combination stiffener and capacitor having a lateral width less than the lateral width of the substrate, and the combination stiffener and capacitor having sides and a lid, the lid extending between the sides and over the first electronic component and the second electronic component, and the combination stiffener and capacitor comprising a plurality of capacitor blocks, the combination stiffener and capacitor comprising a structural material coupled to the substrate and having a shape configured to provide mechanical support for the substrate, and each of the plurality of capacitor blocks of the combination stiffener and capacitor comprising first and second electrodes forming a capacitor, wherein the first electronic component and a first one of the plurality of capacitor blocks are in electrical communication, and wherein the second electronic component and a second one of the plurality of capacitor blocks are in electrical communication.

2. The electronic device package of claim 1, wherein the first electronic component and the second electronic component and the combination stiffener and capacitor are on a same side of the substrate.

3. The electronic device package of claim 2, wherein the combination stiffener and capacitor is in an outer portion of the side of the substrate.

4. The electronic device package of claim 2, wherein the combination stiffener and capacitor is about a periphery of the first electronic component and the second electronic component.

5. The electronic device package of claim 1, wherein the first electronic component and the second electronic component are in a center portion of the side of the substrate.

6. The electronic device package of claim 1, wherein a top profile of the shape comprises a non-rectangular shape.

7. The electronic device package of claim 1, wherein a top profile of the shape comprises an interior opening.

8. The electronic device package of claim 7, wherein the first electronic component and the second electronic component are disposed in the opening.

9. The electronic device package of claim 1, wherein a top profile of the shape comprises an L configuration, a T configuration, an I configuration, a C configuration, a U configuration, an O configuration, or a combination thereof.

10. The electronic device package of claim 1, wherein a vertical cross-section of the shape comprises an L configuration, a T configuration, an I configuration, a C configuration, a U configuration, an O configuration, or a combination thereof.

11. The electronic device package of claim 1, wherein the shape comprises a ring configuration.

12. The electronic device package of claim 1, further comprising a first conductive element to electrically couple the first electronic component and the first one of the plurality of capacitor blocks, and a second conductive element to electrically couple the second electronic component and the second one of the plurality of capacitor blocks.

13. The electronic device package of claim 12, wherein the first conductive element and the second conductive element are disposed at least partially within a thickness of the substrate.

14. The electronic device package of claim 1, wherein the first one and the second one of the plurality of capacitor blocks have different capacitance values.

15. A computing system, comprising:
a motherboard; and
an electronic device package as recited in claim 1 operably coupled to the motherboard.

16. The system of claim 15, wherein the computing system comprises a desktop computer, a laptop, a tablet, a smartphone, a wearable device, a server, or a combination thereof.

17. The system of claim 15, further comprising a processor, a memory device, a heat sink, a radio, a slot, a port, or a combination thereof operably coupled to the motherboard.

* * * * *